United States Patent
Lee et al.

(10) Patent No.: US 9,893,738 B2
(45) Date of Patent: Feb. 13, 2018

(54) ANALOG-TO-DIGITAL CONVERTER AND COMMUNICATION DEVICE INCLUDING THE SAME

(71) Applicant: Samsung Electronics Co., Ltd., Suwon-si, Gyeonggi-do (KR)

(72) Inventors: Jae-hoon Lee, Suwon-si (KR); Seung-hyun Oh, Seoul (KR); Jong-woo Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/469,712

(22) Filed: Mar. 27, 2017

(65) Prior Publication Data

US 2017/0331488 A1 Nov. 16, 2017

(30) Foreign Application Priority Data

May 11, 2016 (KR) .......................... 10-2016-0057827
Jul. 29, 2016 (KR) .......................... 10-2016-0097022

(51) Int. Cl.
*H04M 1/08* (2006.01)
*H03M 1/12* (2006.01)
*H03M 1/08* (2006.01)
*H04L 27/26* (2006.01)

(52) U.S. Cl.
CPC .......... *H03M 1/1245* (2013.01); *H03M 1/08* (2013.01); *H04L 27/2688* (2013.01)

(58) Field of Classification Search
CPC ............ H04M 1/08; H04M 1/12; H04B 27/26
See application file for complete search history.

(56) References Cited

U.S. PATENT DOCUMENTS

| | | | |
|---|---|---|---|
| 8,030,974 B1* | 10/2011 | Oo | .......................... G11C 27/02 327/94 |
| 8,487,602 B2 | 7/2013 | Lee | |
| 8,525,574 B1* | 9/2013 | Duggal | ............... H03K 17/063 327/390 |
| 8,664,979 B2 | 3/2014 | Doris et al. | |
| 8,674,863 B2 | 3/2014 | Grilo et al. | |
| 9,130,519 B1 | 9/2015 | Keramat et al. | |
| 2014/0159680 A1 | 6/2014 | Chiu et al. | |
| 2015/0188536 A1 | 7/2015 | Tang et al. | |
| 2015/0311895 A1 | 10/2015 | Ali | |
| 2016/0027528 A1* | 1/2016 | Verbruggen | ........... G11C 27/02 341/122 |

* cited by examiner

*Primary Examiner* — Jaison Joseph
(74) *Attorney, Agent, or Firm* — Harness, Dickey & Pierce, P.L.C.

(57) ABSTRACT

An analog-to-digital converter includes a sample hold circuit configured to receive an analog input signal based on an operating mode, the operating mode being one of at least two modes including a sample mode and a hold mode. The sample hold circuit includes a first transistor including a control terminal and a first terminal, the first transistor configured to receive a control signal via the control terminal and receive the analog input signal via the first terminal. The analog-to-digital converter further includes a bootstrap switch operationally connected to the control terminal and the first terminal of the first transistor, the bootstrap switch configured to form a first current path from a power source based on the analog input signal and a boosted voltage of the control terminal of the first transistor in the sample mode, the control terminal bing along the first current path in the sample mode.

19 Claims, 15 Drawing Sheets

ANALOG-TO-DIGITAL CONVERTER AND COMMUNICATION DEVICE INCLUDING THE SAME

CROSS-REFERENCE TO RELATED APPLICATION

This application claims the benefit of Korean Patent Applications No. 10-2016-0057827, filed on May 11, 2016, and No. 10-2016-0097022, filed on Jul. 29, 2016, in the Korean Intellectual Property Office, the disclosures of which are incorporated herein in their entireties by reference.

BACKGROUND

One or more example embodiments of inventive concepts relate to an analog-to-digital converter, such as an analog-to-digital converter including a sample hold circuit, and a communication device including the analog-to-digital converter.

An analog-to-digital converter (hereinafter, ADC) is a device for converting an analog input signal into a digital value by comparing the analog input signal with a reference voltage. That is, the ADC is a device for converting an analog input signal into a digital output signal. Examples of the ADC include a flash-type ADC, a successive approximation register (SAR)-type ADC, a pipeline-type ADC, etc., which are used in diverse application fields. For example, in the case of an ADC used in communication devices, as the amount of data exchanged via the communication devices increases, an analog input signal that is processed in the ADC has a high frequency component, and noise in the input signal will increase when the ADC converts the high frequency analog input signal.

SUMMARY

Inventive concepts provide an analog-to-digital converter including a sample hold circuit forming a current path from a power source in an analog-to-digital conversion operation, and a communication device including the analog-to-digital converter.

According to an example embodiment of inventive concepts, there is provided an analog-to-digital converter including a sample hold circuit configured to receive an analog input signal based on an operating mode, the operating mode being one of at least two modes, the at least two modes including a sample mode and a hold mode, and a signal converter configured to convert the sample signal into a digital signal, wherein the sample hold circuit includes a first transistor including a control terminal and a first terminal, the first transistor configured to receive a control signal via the control terminal and receive the analog input signal via the first terminal. The analog-to-digital converter further includes a bootstrap switch operationally connected to the control terminal and the first terminal of the first transistor, the bootstrap switch configured to form a first current path from a power source based on the analog input signal and generate a boosted voltage of the control terminal of the first transistor in the sample mode, the control terminal being along the first current path in the sample mode.

According to another example embodiment of inventive concepts, there is provided a communication device including an analog-to-digital converter configured to convert an analog input signal into a digital signal based on an operating mode, the operating mode being one of at least two modes, the at least two modes including a sample mode and a hold mode, wherein the analog-to-digital converter includes a first transistor configured to receive a control signal via a control terminal and receive the analog input signal via an input terminal, and a bootstrap switch configured to form a current path from a power source, and configured to control a voltage of the control terminal of the first transistor, such that the voltage of the control terminal of the first transistor follows the analog input signal along the current path in the sample mode.

According to another example embodiment of the inventive concepts, there is provided a sample hold circuit including a bootstrap capacitor having a first terminal and a second terminal, and a charge supply circuit including a first transistor. The first transistor is configured to receive an analog input signal. The first transistor is operationally connected to the first terminal of the bootstrap capacitor, and is configured to reduce a noise generated in the sample hold circuit by maintaining a voltage difference between the second terminal of the bootstrap capacitor and the analog input signal.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Hereinafter, example embodiments of inventive concepts will be described in detail by referring to the accompanying drawings.

Figure 1:
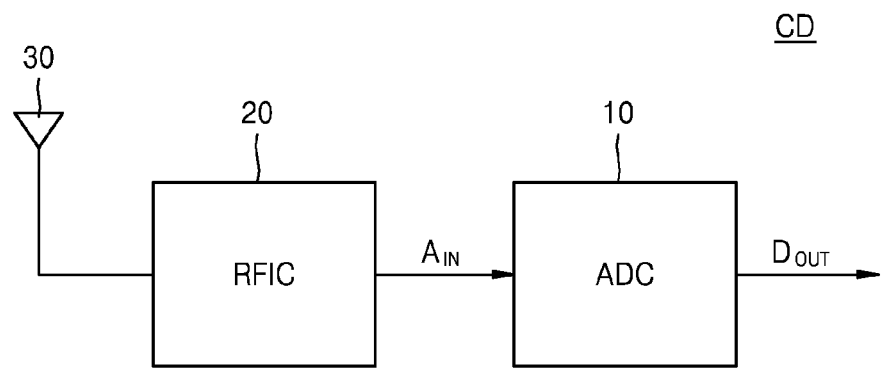
FIG. 1 is a block diagram schematically showing a communication device according to an example embodiment.

FIG. 1 is a block diagram schematically showing a communication device CD according to an example embodiment.

Referring to FIG. 1, the communication device CD may include a radio frequency integrated circuit (RFIC) 20, an analog-to-digital converter (hereinafter, referred to as an ADC) 10, and an antenna 30. According to an example embodiment, the communication device CD may refer to a receiving terminal receiving various information. However, inventive concepts are not limited thereto. In some example embodiments, the communication device CD may refer to a transmitting terminal transmitting various information or a transceiver performing both transmission and reception.

The antenna 30 may receive a wireless signal from another communication device to perform a communication operation with the other communication device. The RFIC 20 may convert the wireless signal received via the antenna 30 into a baseband signal. According to an example embodiment, the RFIC 20 may generate an analog input signal $A_{IN}$ by using a down conversion method including two operations, that is, lowering a frequency of the wireless signal to an intermediate frequency signal and lowering the intermediate frequency signal to the baseband signal. According to another example embodiment, the RFIC 20 may generate the analog input signal $A_{IN}$ by using a direct conversion method directly converting the wireless signal WS into the baseband signal.

The ADC 10 may receive the analog input signal $A_{IN}$ and convert the analog input signal $A_{IN}$ into a digital signal $D_{out}$. According to an example embodiment, the ADC 10 may operate in a sample mode and a hold mode, and may generate a sample signal sampled from the analog input signal $A_{IN}$ and convert the sample signal into a digital signal $D_{out}$. For example, the ADC 10 may include a transistor including a gate, or control terminal to which a control signal for controlling a timing of the sample mode and the hold mode is input, and a source, or first terminal to which the analog input signal $A_{IN}$ is input. The transistor may be in an off state in the hold mode and may be in an on state in the sample mode and provide an analog output signal substantially the same as the analog input signal $A_{IN}$ to a sampling capacitor array including a plurality of sampling capacitors via a second terminal. The ADC 10 may generate the sample signal via the sampling capacitor array.

The ADC 10 according to an example embodiment may boost, in the sample mode, a voltage of the control terminal in correspondence to a voltage of the first terminal, in order to maintain constant a difference between the voltage of the control terminal of the transistor transmitting the analog input signal $A_{IN}$ to the sampling capacitor and the voltage of the first terminal. Accordingly, in the sample mode, the ADC 10 may maintain constant an on-resistance of the transistor, and thus, may provide an analog output signal substantially the same as the analog input signal $A_{IN}$ received by the transistor to the sampling capacitor array. Also, the ADC 10 may form a current path from a power source based on the analog input signal $A_{IN}$, thereby removing noise from the analog input signal $A_{IN}$ which is generated when the ADC 10 is changed from the hold mode to the sample mode. Thus, the ADC 10 may output a more reliable digital signal.

According to an example embodiment, the RFIC 20 and the ADC 10 may be realized as the single chip. For example, the RFIC 20 and the ADC 10 may be realized as a communication chip, such as a modem chip. However, inventive concepts are not limited thereto. In some example embodiments, the RFIC 20 and the ADC 10 may be realized as different chips. Hereinafter, various example embodiments of the ADC 10 will be described in detail.

Figure 2:
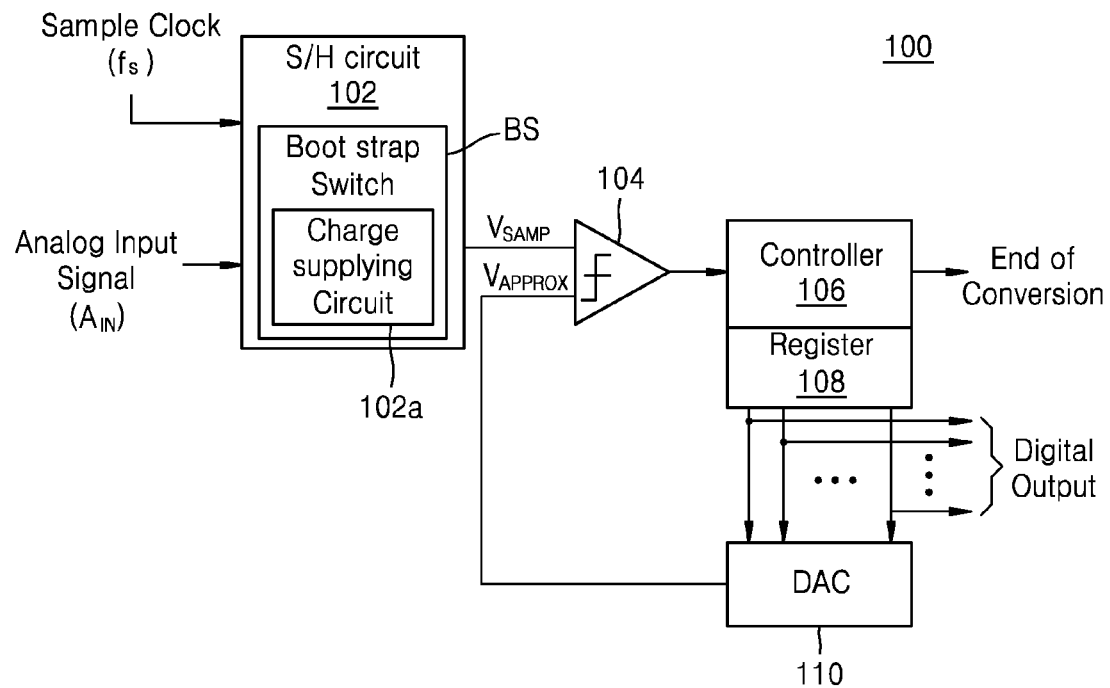
FIG. 2 is a block diagram showing in detail an analog-to-digital converter (ADC) according to an example embodiment.

FIG. 2 is a block diagram showing in detail an ADC 100 according to an example embodiment.

Referring to FIG. 2, the ADC 100 may include a sample hold circuit 102, a comparator 104, a controller 106, a register 108, and a digital/analog converter (hereinafter, referred to as a DAC) 110. However, the ADC 100 according to inventive concepts is not limited to the structure illustrated in FIG. 2, and various other ADCs may be included in inventive concept.

The ADC 100 may be realized as part of a chip (for example, a communication chip). According to an example embodiment, an input of the ADC 100 may be received from another block (for example, the RFIC (20 of FIG. 1)) in the chip, and an output of the ADC 100 may be provided to the outside via an output terminal of the chip, that is, an output node. However, inventive concepts are not limited thereto. In some example embodiments, the output of the ADC 100 may be provided to another block in the chip. Also, in some example embodiments, the input of the ADC 100 may be received from the outside via an input terminal of the chip.

The sample hold circuit 102 may receive an analog input signal $A_{IN}$ and a sample clock signal Sample Clock, and couple the analog input signal $A_{IN}$ to the sample clock signal Sample Clock and sample the coupled analog input signal $A_{IN}$ and sample clock signal Sample Clock to generate a sample signal $V_{SAMP}$. The sample hold circuit 102 may operate in a hold mode and a sample mode to generate the sample signal $V_{SAMP}$, and in the sample mode, may provide the analog input signal $A_{IN}$ to a sampling capacitor array. The sampling capacitor array may be pre-charged by the analog input signal $A_{IN}$. The sample hold circuit 102 may generate the sample signal $V_{SAMP}$ from the sampling capacitor array charged in the hold mode and provide the sample signal $V_{SAMP}$ to the comparator 104.

The controller 106 may set digital bits for generating an analog approximate signal $V_{APPROX}$ compared with the sample signal $V_{SAMP}$, by setting a digital approximate value with respect to the sample signal $V_{SAMP}$ stored in the register 108. The controller 106 may provide as a digital output corresponding to the set digital bits the sample signal $V_{SAMP}$ stored in the register 108 to the DAC 110. The DAC 110 may convert the digital output into an analog approximate signal $V_{APPROX}$ corresponding thereto and provide the analog approximate signal $V_{APPROX}$ to the comparator 104. The comparator 104 may compare the sample signal $V_{SAMP}$ generated from the sample hold circuit 102 with the analog approximate signal $V_{APPROX}$. The comparator 104 may provide a result of comparing the sample signal $V_{SAMP}$ and the analog approximate signal $V_{APPROX}$ to the controller 106. The controller 106 may reset digital bits, which are different from the previous digital bits, based on the result of the comparison, and may provide a digital output corresponding to the reset digital bits to the DAC 110. The DAC 110 may convert the digital output into an analog approximate signal $V_{APPROX}$ corresponding thereto and provide a new analog approximate signal $V_{APPROX}$ to the comparator 104. The comparator 104 may again compare the sample signal $V_{SAMP}$ with the analog approximate signal $V_{APROX}$. As such, the controller 106 may control the comparison operation to be performed at least one time, until the end of the conversion of the analog input signal $A_{IN}$ into the digital output corresponding thereto.

The sample hold circuit 102 according to an example embodiment may include a bootstrap switch (BS), and the bootstrap switch BS may include a charge supply circuit 102a. The charge supply circuit 102a may include at least one transistor. The charge supply circuit 102a may form a current path from a power source in the sample mode. The bootstrap switch BS may control a voltage of a control terminal of the transistor for controlling the sample hold mode to track the analog input signal $A_{IN}$, based on the current path. That is, the bootstrap switch BS may control the voltage of the control terminal of the transistor to be boosted by a voltage corresponding to the analog input signal $A_{IN}$, based on the current path, thereby maintaining an on-resistance of the transistor to be constant. According to an example embodiment, the voltage corresponding to the analog input signal $A_{IN}$ may be the same or substantially the same as the analog input signal $A_{IN}$. However, this is only an example embodiment, and example embodiments of inventive concepts are not limited thereto. A voltage corresponding to the analog input signal $A_{IN}$ may be less than the analog input signal $A_{IN}$, based on a characteristic of the charge supply circuit 102a. For example, the characteristic of the charge supply circuit 102a may be related to a level of a threshold voltage of the transistor included in the charge supply circuit 102a.

As such, the ADC 100 according to inventive concepts may form the current path from the power source in the sample mode and maintain the on-resistance of the transistor to be constant based on the current path, thereby removing noise from the analog input signal $A_{IN}$.

Figure 3:
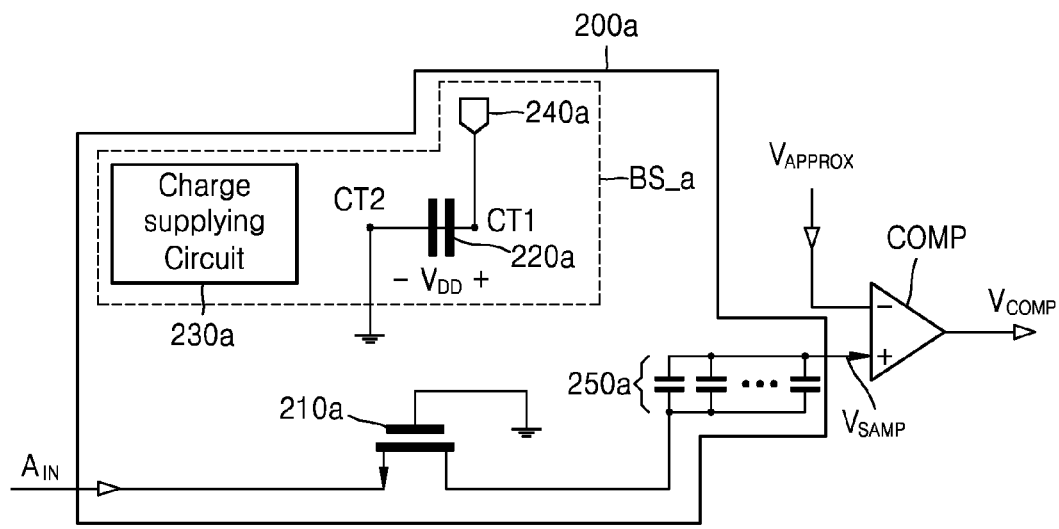
FIG. 3 is a view for describing an operation of a sample hold circuit in a hold mode, according to an example embodiment.

FIG. 3 is a view for describing an operation of a sample hold circuit 200a in a hold mode according to an example embodiment.

Referring to FIG. 3, the sample hold circuit 200a may include a transistor 210a for controlling a sample mode and a hold mode, the bootstrap switch BS, and a sampling capacitor array 250a. The bootstrap switch BS may include a bootstrap capacitor 220a, a charge supply circuit 230a, and a power source terminal 240a. Also, although it is not illustrated in detail, the bootstrap switch BS may further include switch devices for forming a connection state illustrated in FIG. 3 in the hold mode. This aspect will be described in detail later. Also, FIG. 3 illustrates that the transistor 210a is an n-channel metal-oxide semiconductor (NMOS) transistor. However, inventive concepts are not limited thereto, and the transistor 210a may be realized as a p-channel metal-oxide semiconductor (PMOS) transistor.

According to an example embodiment, in the hold mode, a first capacitor terminal CT1 of the bootstrap capacitor 220a may be connected to the power source terminal 240a and a second capacitor terminal CT2 of the bootstrap capacitor 220a may be connected to a ground, so that the bootstrap capacitor 220a may be pre-charged to a power source voltage $V_{DD}$. The charge supply circuit 230a according to an example embodiment is electrically disconnected from the bootstrap capacitor 220a, and may not form an additional current path. The power source terminal 240a may correspond to a terminal which is electrically connected to a power source and to which a power source voltage is applied from the power source.

Also, in the hold mode, a control terminal (hereinafter, a gate terminal) of the transistor 210a may be connected to the ground so that the transistor 210a may be in an off state. Thus, an analog input signal $A_{IN}$ received to a first terminal (hereinafter, a source terminal) of the transistor 210a may be blocked via the transistor 210a so that an analog output signal may not be provided to the coupling capacitor array 250a. The sample hold circuit 200a may generate a sample signal $V_{SAMP}$ from a voltage of the coupling capacitor array 250a charged in the sample mode prior to the hold mode and provide the generated sample signal $V_{SAMP}$ to a comparator COMP. As described above, the comparator COMP may receive the sample signal $V_{SAMP}$ and an analog approximate signal $V_{APPROX}$ and compare the sample signal $V_{SAMP}$ with the analog approximate signal $V_{APPROX}$ to generate a comparison result $V_{COMP}$, and the ADC may convert the analog input signal $A_{IN}$ into a digital signal by using the comparison result $V_{COMP}$.

Figure 4:
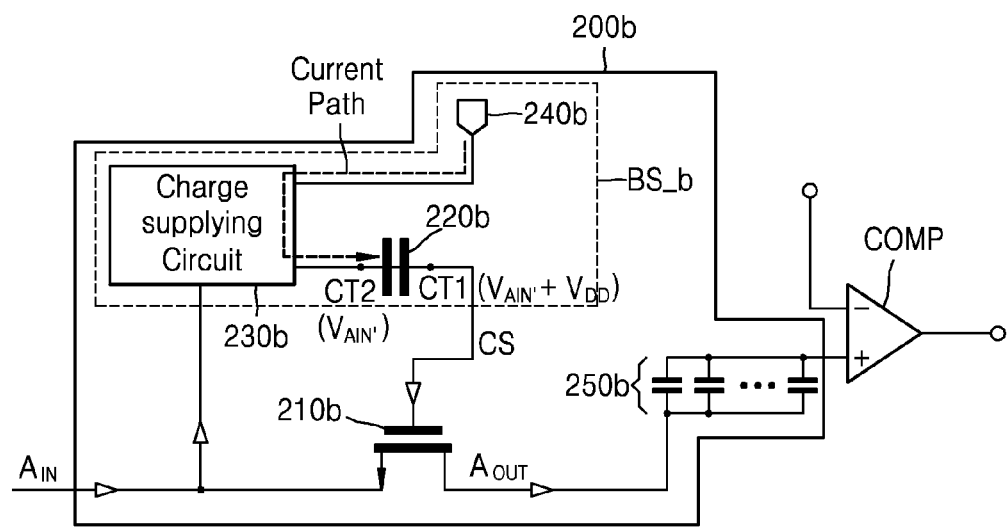
FIG. 4 is a view for describing an operation of a sample hold circuit in a sample mode, according to an example embodiment.

FIG. 4 is a view for describing an operation of a sample hold circuit 200b in a sample mode according to an example embodiment.

Referring to FIG. 4, according to an example embodiment, in the sample mode, a first capacitor terminal CT1 of a bootstrap capacitor 220b may be connected to a gate terminal of a transistor 210b, and a second capacitor terminal CT2 of the bootstrap capacitor 220b may be connected to a charge supply circuit 230b. Also, the charge supply circuit 230b may be connected to a power source terminal 240b. The charge supply circuit 230b according to an example embodiment may form a current path from the power source terminal 240b, based on an analog input signal $A_{IN}$. The current path may be formed between the power source terminal 240b and the second capacitor terminal CT2 of the bootstrap capacitor 220b. However, inventive concepts are not limited thereto. For example, the charge supply circuit 230b may additionally form a current path from a terminal included in the bootstrap switch BS.

Also, an input impedance of the charge supply circuit 230b with respect to the analog input signal $A_{IN}$ may be greater than an impedance of the bootstrap capacitor 220b. Thus, a driving efficiency of the transistor 210b with respect to the analog input signal $A_{IN}$ may be increased when the analog input signal $A_{IN}$ is input to the charge supply circuit 230b according to the example embodiment, compared to the case when the analog input signal $A_{IN}$ is directly input to the second capacitor terminal CT2 of the bootstrap capacitor 220b.

The charge supply circuit 230b may supply a charge to the bootstrap capacitor 220b along the current path so that a voltage of the second capacitor terminal CT2 of the bootstrap capacitor 220b, which was 0V in the hold mode, is changed to a voltage $V_{AIN}'$ corresponding to the analog input signal $A_{IN}$. According to an example embodiment, the voltage $V_{AIN}'$ corresponding to the analog input signal $A_{IN}$ may be the same or substantially the same as the analog input signal $A_{IN}$.

Also, the charge supply circuit 230b may block the formed current path, based on the analog input signal $A_{IN}$ and a voltage of a terminal of the bootstrap capacitor 220b. For example, when the voltage of the second capacitor terminal CT2 of the bootstrap capacitor 220b is changed to the voltage $V_{AIN}'$ corresponding to the analog input signal $A_{IN}$, the charge supply circuit 230b may block the formed current path so that a charge is not able to be supplied to the bootstrap capacitor 220b via the current path.

Via the operation of the charge supply circuit 230b, the voltage $V_{AIN}'$ may change according to the change of the analog input signal $A_{IN}$, and thus, the voltage $V_{AIN}'$ may track the analog input signal $A_{IN}$. According to another example embodiment, a level of the voltage $V_{AIN}'$ may be lower than a level of the analog input signal $A_{IN}$, and a difference between the level of the voltage $V_{AIN}'$ and the level of the analog input signal $A_{IN}$ may vary according to a characteristic of the charge supply circuit 230b.

Since the bootstrap capacitor 220b is pre-charged to the power source voltage $V_{DD}$ in the hold mode, in the sample mode, the first capacitor terminal CT1 of the bootstrap capacitor 220b may be boosted from the power source voltage $V_{DD}$ in correspondence to the voltage $V_{AIN}'$ of the second capacitor terminal CT2 of the bootstrap capacitor 220b to have a voltage of $V_{AIN}'+V_{DD}$. The first capacitor terminal CT1 of the bootstrap capacitor 220b may be electrically connected to a gate terminal of the transistor 210b, and accordingly, the bootstrap capacitor 220b may provide a control signal CS corresponding to the voltage of $V_{AIN}'+V_{DD}$ of the first capacitor terminal CT1 to the gate terminal of the transistor 210b. As a result, a voltage of the gate terminal of the transistor 210b may be boosted to the voltage of $V_{AIN}'+V_{DD}$ via the bootstrap capacitor 220b.

In the sample mode, the transistor 210b may be in an on state in response to the control signal CS, and a source terminal of the transistor 210b may receive the analog input signal $A_{IN}$ and a drain terminal of the transistor 210b may output an analog output signal $A_{OUT}$ to the sampling capacitor array 250b. Sampling capacitors of the sampling capacitor array 250b may be charged via the analog output signal $A_{OUT}$.

According to an example embodiment, in the sample mode, a difference between the voltage $V_{AIN}'+V_{DD}$ of the gate terminal of the transistor 210b and a voltage $A_{IN}$ of the source terminal may be constant. Thus, in the sample mode, the on-resistance of the transistor 210b may be maintained to be constant, and the transistor 210b may provide the analog output signal $A_{OUT}$, which is the same as the analog input signal $A_{IN}$, to the sampling capacitor array 250b.

Figure 5:
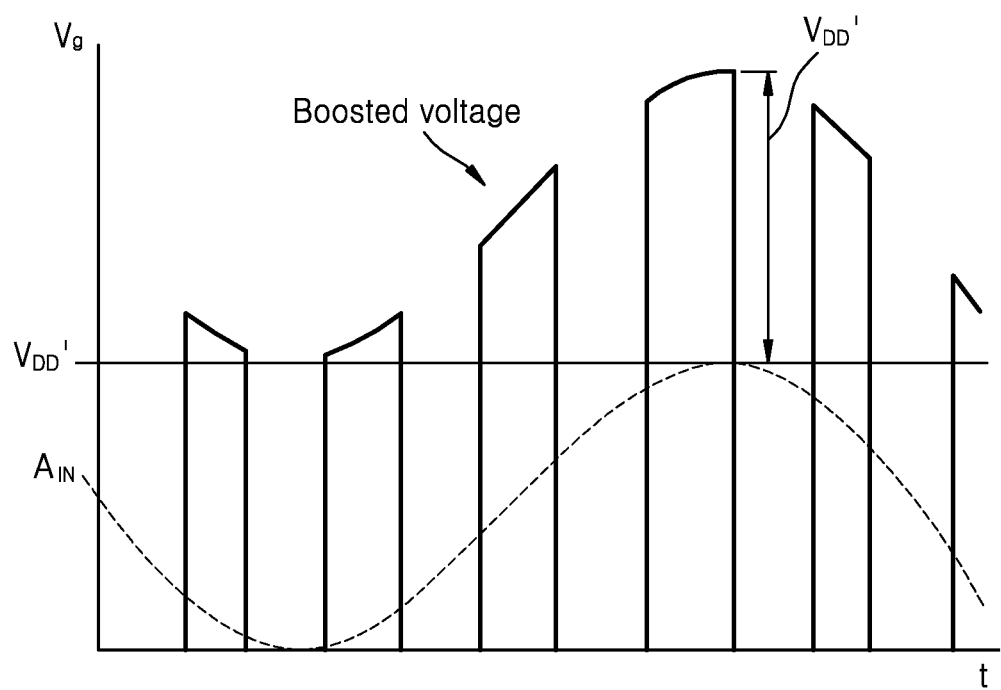
FIG. 5 is a graph for describing a voltage of a gate terminal of a transistor tracking an analog input signal, according to an example embodiment.

FIG. 5 is a graph for describing a voltage Vg of the gate terminal of the transistor tracking the analog input signal $A_{IN}$, according to an example embodiment.

Referring to FIGS. 3, 4, and 5, in the hold mode, the voltage Vg of the gate terminal of the transistor 210a may be connected to the ground, and thus, may correspond to 0V. In the sample mode, the gate terminal of the transistor 210b may be connected to the bootstrap capacitor 220b. The voltage Vg of the gate terminal of the transistor 210b may track, or follow, the analog input signal $A_{IN}$, via the bootstrap capacitor 220b. A difference between the voltage Vg of the gate terminal of the transistor 210b and the analog input signal $A_{IN}$ may be maintained as a certain voltage $V_{DD}'$. Thus, since a difference between the voltage of the source terminal of the transistor 210b, to which the analog input signal $A_{IN}$ is input, and the voltage Vg of the gate terminal of the transistor 210b is constant as the voltage $V_{DD}'$, the on-resistance of the transistor 210b may be maintained to be constant in the sample mode. Also, a level of the voltage $V_{DD}'$ may be lower than a level of the power source voltage $V_{DD}$ pre-charged in the bootstrap capacitor 220b illustrated in FIG. 4A. This aspect will be described in detail later.

Figure 6:
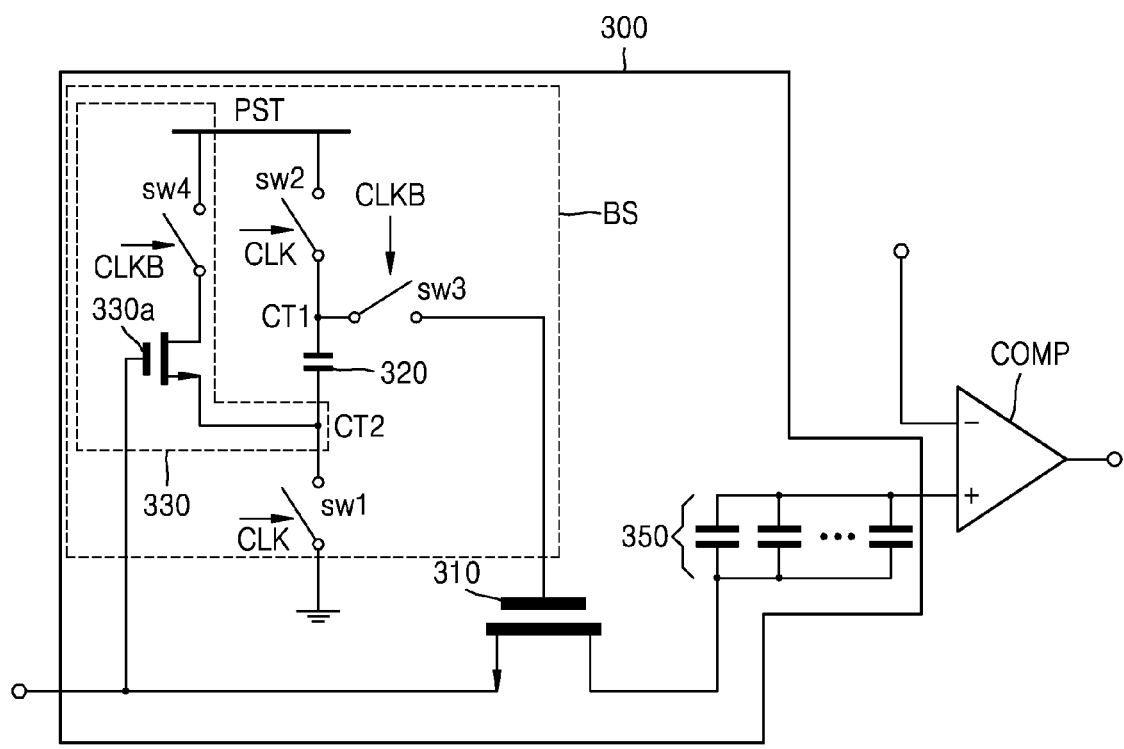
FIG. 6 is a circuit diagram showing in detail a sample hold circuit according to an example embodiment.

FIG. 6 is a circuit diagram showing in detail a sample hold circuit 300 according to an example embodiment.

Referring to FIG. 6, the sample hold circuit 300 may include a first transistor 310 for controlling a sample mode and a hold mode, a bootstrap switch BS, and a sampling capacitor array 350. The bootstrap switch BS may include a charge supply circuit 330, a bootstrap capacitor 320, and switch devices sw1, sw2, and sw3. According to an example embodiment, a second capacitor terminal CT2 of the bootstrap capacitor 320 may be connected to a ground GND via the first switch device sw1. A first capacitor terminal CT1 of the bootstrap capacitor 320 may be connected to a power source terminal (PST) via the second switch device sw2, or to a gate terminal of the first transistor 310 via the third switch device sw3. The PST may correspond to a terminal which is connected to a power source and to which a power source voltage is applied from the power source.

Also, the charge supply circuit 330 may include a second transistor 330a and a fourth switch device sw4. A gate terminal of the second transistor 330a may be connected to a source terminal of the first transistor 310, a source terminal of the second transistor 330a may be connected the second capacitor terminal CT2 of the bootstrap capacitor 320, and a drain terminal of the second transistor 330a may be connected to the PST via the fourth switch device sw4. An ADC may include a timing controller, and an on/off state of the first switch device sw1 and the second switch device sw2 may be controlled via a clock signal CLK received from the timing controller and on/off of the third switch device sw3 and the fourth switch device sw4 may be controlled via a clock signal B CLKB received from the timing controller. The clock signal CLK may have a phase opposite that of the clock signal B CLKB, and via the controlling described above, may change a connection state of the sample hold circuit 300 in the sample mode and the hold mode.

FIG. 6 illustrates that the second transistor 330a is an NMOS transistor. However, inventive concepts are not limited thereto. The second transistor 330a may be realized as a PMOS transistor, and further may be realized as a structure for forming a current path from the PST in the sample mode.

The second transistor 330a according to an example embodiment may form a current path from a power source when an operational condition of the transistor is satisfied in the sample mode, and supply a charge to the bootstrap capacitor 320 along the current path. Aspects of inventive concepts will be described in detail later.

Figure 7:
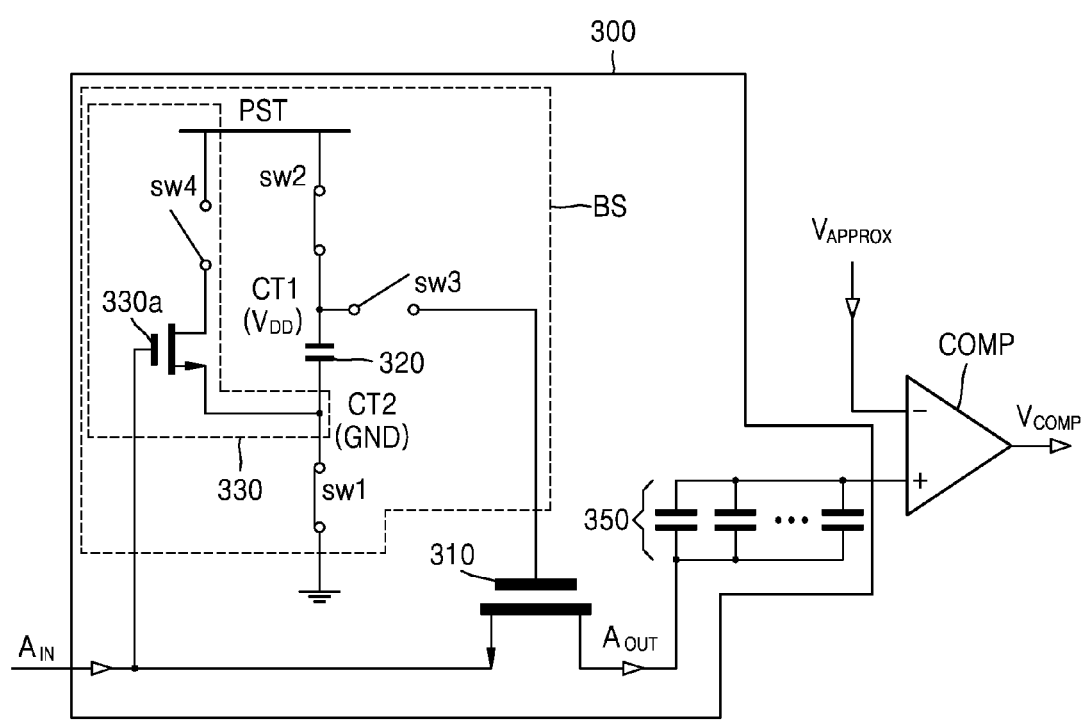
FIG. 7 is a circuit diagram for describing an operation of a sample hold circuit in a hold mode, according to an example embodiment.

FIG. 7 is a circuit diagram for describing an operation of a sample hold circuit 300a in a hold mode, according to an example embodiment.

Referring to FIG. 7, according to an example embodiment, in the hold mode, a first capacitor terminal CT1 of a bootstrap capacitor 320 may be connected to a PST via a second switch device sw2, and a second capacitor terminal CT2 of the bootstrap capacitor 320 may be connected to a ground GND via a first switch device sw1, so that the bootstrap capacitor 320 may be configured to be pre-charged to a power source voltage $V_{DD}$. The second transistor 330a according to an example embodiment may not form a current path from a power source in the hold mode, and may be disconnected from the bootstrap capacitor 320.

Also, although it is not illustrated in FIG. 7, the gate terminal of the first transistor 310 may be connected to the ground and may be in an off state as illustrated in FIG. 4, and the analog input signal $A_{IN}$ received to the source terminal of the first transistor 310 may be blocked via the first transistor 310 so that an analog output signal may not be provided to the coupling capacitor array 250a. Sequential operations were described with referenced to FIG. 4, and thus, descriptions thereof will be omitted.

Figure 8:
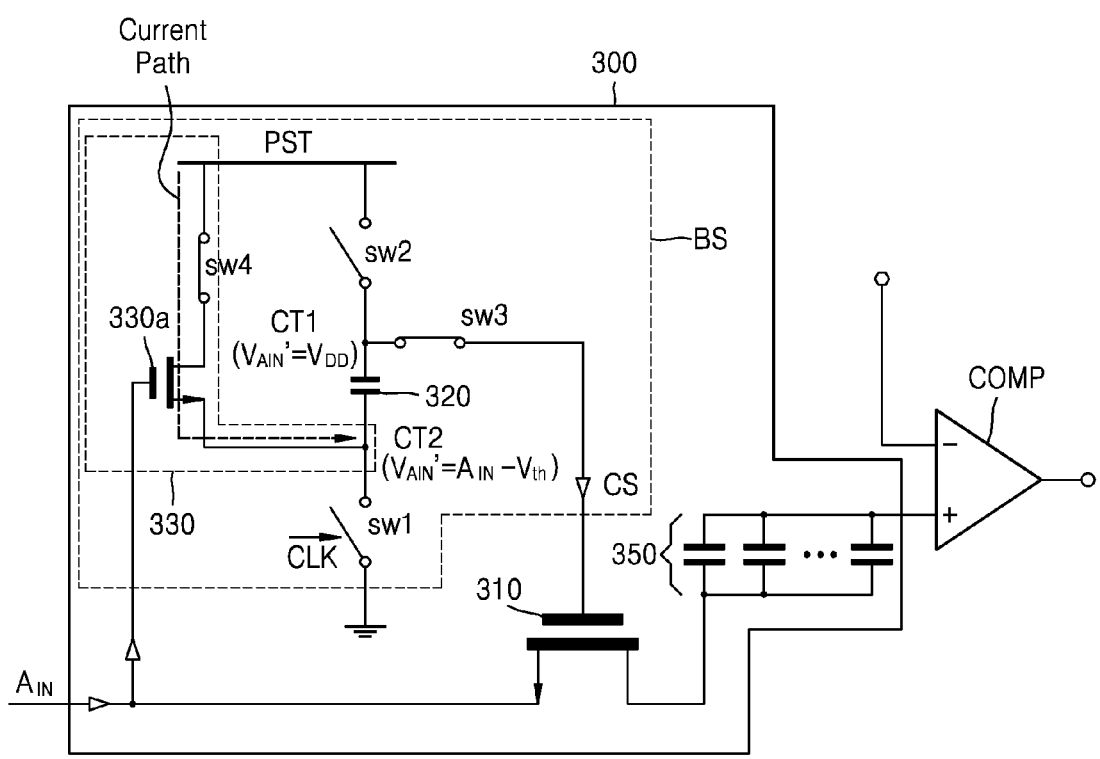
FIG. 8 is a circuit diagram for describing an operation of a sample hold circuit in a sample mode, according to an example embodiment.

FIG. 8 is a circuit diagram for describing an operation of the sample hold circuit 300 in the sample mode, according to an example embodiment.

Referring to FIG. 8, according to an example embodiment, in the sample mode, the first capacitor terminal CT1 of the bootstrap capacitor 320 may be connected to the gate terminal of the first transistor 310 via the third switch device sw3, and the second capacitor terminal CT2 of the bootstrap capacitor 320 may be connected to the source terminal of the second transistor 330a. The drain terminal of the second transistor 330 may be connected to the PST via the fourth switch device sw4.

According to an example embodiment, when the analog input signal $A_{IN}$ is applied to the second transistor 330a, the second transistor 330a may form a current path from the PST based on the analog input signal $A_{IN}$. According to an example embodiment, the second transistor 330a may form a current path when a level of the analog input signal $A_{IN}$ is equal to or greater than a level of a reference voltage. The level of the reference voltage may be a sum of a level of a threshold voltage Vth of the second transistor 330a and a level of a voltage of the second capacitor terminal CT2 of the bootstrap capacitor 320. In detail, when the level of the analog input signal $A_{IN}$ is equal to or greater than the level of the reference voltage, the second transistor 330a may form a channel between the drain terminal and the source terminal of the second transistor 330a so that a charge may move between the PST and the second capacitor terminal CT2 of the bootstrap capacitor 320. The channel may correspond to a portion of the current path.

The second transistor 330a may supply a charge to the bootstrap capacitor 320 so that the voltage of the second capacitor terminal CT2 of the bootstrap capacitor 320 is changed from 0V to the voltage $V_{AIN}'$ corresponding to the analog input signal $A_{IN}$ via the current path. Until the voltage $V_{AIN}'$ of the second capacitor terminal CT2 of the bootstrap capacitor 320 reaches a voltage of $A_{IN}$-$V_{th}$, the formed current path may be maintained, and when the voltage $V_{AIN}'$ of the second capacitor terminal CT2 of the bootstrap capacitor 320 reaches the voltage of $A_{IN}$-Vth, the current path may be blocked according to an operational condition of the second transistor 330a. Based on such operational characteristics of the second transistor 330a, the voltage $V_{AIN}'$ of the second capacitor terminal CT2 of the bootstrap capacitor 320 may be lower than the analog input signal $A_{IN}$.

Via the operation of the second transistor 330a of the charge supply circuit 330, the voltage $V_{AIN}'$ of the second capacitor terminal CT2 of the bootstrap capacitor 320 may track the analog input signal $A_{IN}$. In the hold mode, the bootstrap capacitor 320 is pre-charged to the power source voltage $V_{DD}$, and thus, in the sample mode, the first capacitor terminal CT1 of the bootstrap capacitor 320 may have a voltage of $V_{AIN}'$+$V_{DD}$, which is the power source voltage $V_{DD}$ boosted in correspondence to the voltage $V_{AIN}'$ of the second capacitor terminal CT2 of the bootstrap capacitor 320. The bootstrap capacitor 320 may provide a control signal CS corresponding to the voltage $V_{AIN}'$+$V_{DD}$ of the first capacitor terminal CT1 to the gate terminal of the first transistor 310. In the sample mode, a voltage of the gate terminal of the first transistor 310 may be boosted to the voltage of $V_{AIN}'$+$V_{DD}$ via the bootstrap capacitor 320, and since a voltage difference $V_{DD}$-$V_{th}$ between a source voltage $A_{IN}$ of the first transistor 310 and a gate voltage $V_{AIN}'$ (=$A_{IN}$-$V_{th}$)+$V_{DD}$) is constant, the on-resistance of the first transistor 310 may be maintained to be constant. As a result, the first transistor 310 may provide the analog output signal $A_{OUT}$, which is the same as the analog input signal $A_{IN}$, to the sampling capacitor array 350.

Figure 9A:
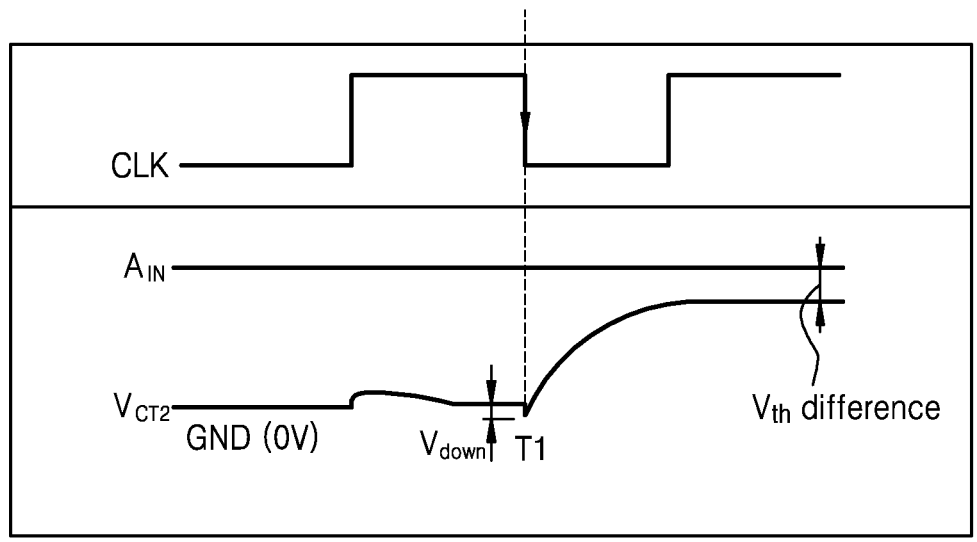
FIGS. 9A through 9C are views for describing compensating an operational condition of a second transistor by controlling a width of a first switch device of FIG. 6, according to an example embodiment.
Figure 9B:
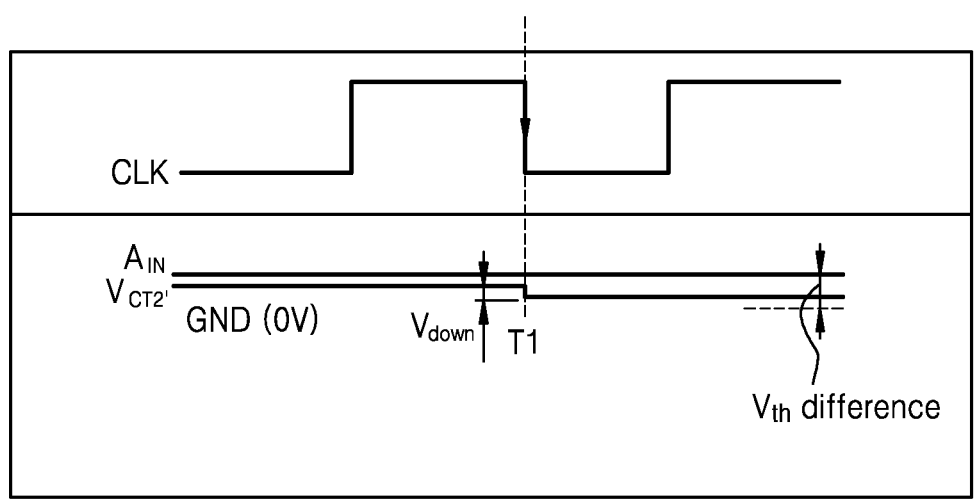
Figure 9C:
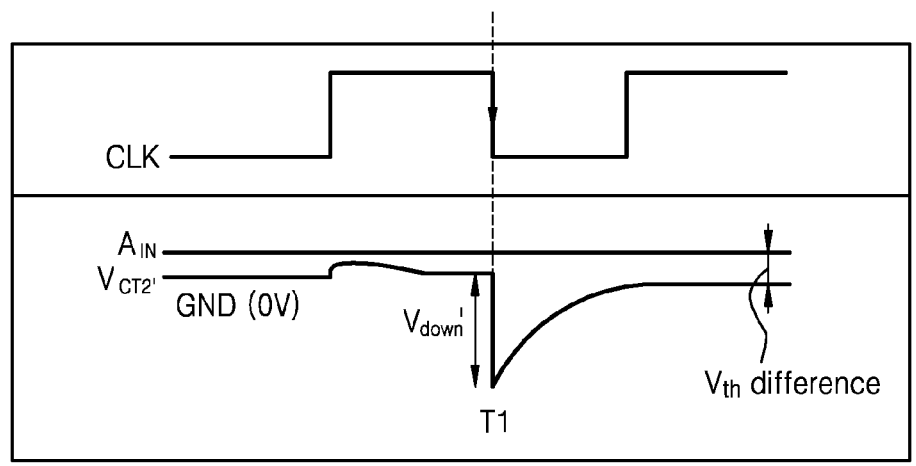

FIGS. 9A through 9C are views for describing how the operational condition of the second transistor 330a is compensated for by controlling a width of the first switch device sw1 of FIG. 6, according to an example embodiment.

Referring to FIGS. 6 and 9A, an on/off state of the first switch device sw1 may be controlled via a clock signal CLK. A voltage $V_{CT2}$ of the second capacitor terminal of the bootstrap capacitor 320 connected to the first switch device sw may be lowered by a certain lowering voltage $V_{down}$, when the first switch device sw1 is converted from a hold mode to a sample mode, that is, at a point T1 corresponding to a falling edge of the clock signal CLK, due to a clock feed through phenomenon caused by a parasitic capacitor element, etc., of the first switch device sw1. As illustrated in FIG. 9A, when the analog input signal $A_{IN}$ is sufficiently greater than 0V, a difference between a voltage (corresponding to the analog input signal $A_{IN}$) of the gate terminal of the second transistor 330a and a voltage (corresponding to the voltage $V_{CT2}$ of the second capacitor terminal of the bootstrap capacitor 320) of the source terminal of the second transistor 330a is greater than the threshold voltage $V_{th}$ of the second transistor 330a at the point T1. Thus, the second transistor 330a may form the current path from the power source in the sample mode, as described above.

However, referring to FIGS. 6 and 9B, when the analog input signal $A_{IN}$ is not sufficiently greater than 0V, the difference between the voltage (corresponding to the analog input signal $A_{IN}$) of the gate terminal of the second transistor 330a and the voltage (corresponding to the $V_{CT2}$ of the second capacitor terminal of the bootstrap capacitor 320) of the source terminal of the second transistor 330a may be less than the threshold voltage $V_{th}$ of the second transistor 330a at the point T1. Thus, the second transistor 330a may not form the current path from the power source in the sample mode.

Referring to FIGS. 6 and 9C, the lowering voltage $V_{down}'$ by which the voltage $V_{CT2}'$ of the second capacitor terminal of the bootstrap capacitor 320 is lowered at the point T1 due to a clock feed through phenomenon, may be greater than the case of FIGS. 9A and 9B, by controlling a size of the first switch device sw1 included in the bootstrap switch BS according to inventive concepts. As a result, the second transistor 330a may always form the current path from the power source in the sample mode. Accordingly, the first switch device sw1 included in the sample hold circuit 300 may have a different size from other switch devices sw2 through sw4. According to an example embodiment, a width of the first switch device sw1 may be increased to increase the lowering voltage $V_{down}'$. Also, the bootstrap switch BS may include the first switch device sw1, a width of which is controlled, so that the second transistor 330a may more likely form the current path from the power source in the sample mode. However, inventive concepts are not limited thereto, and other elements of the first switch device sw1 may be controlled to control the lowering voltage $V_{down}'$.

Figure 10A:
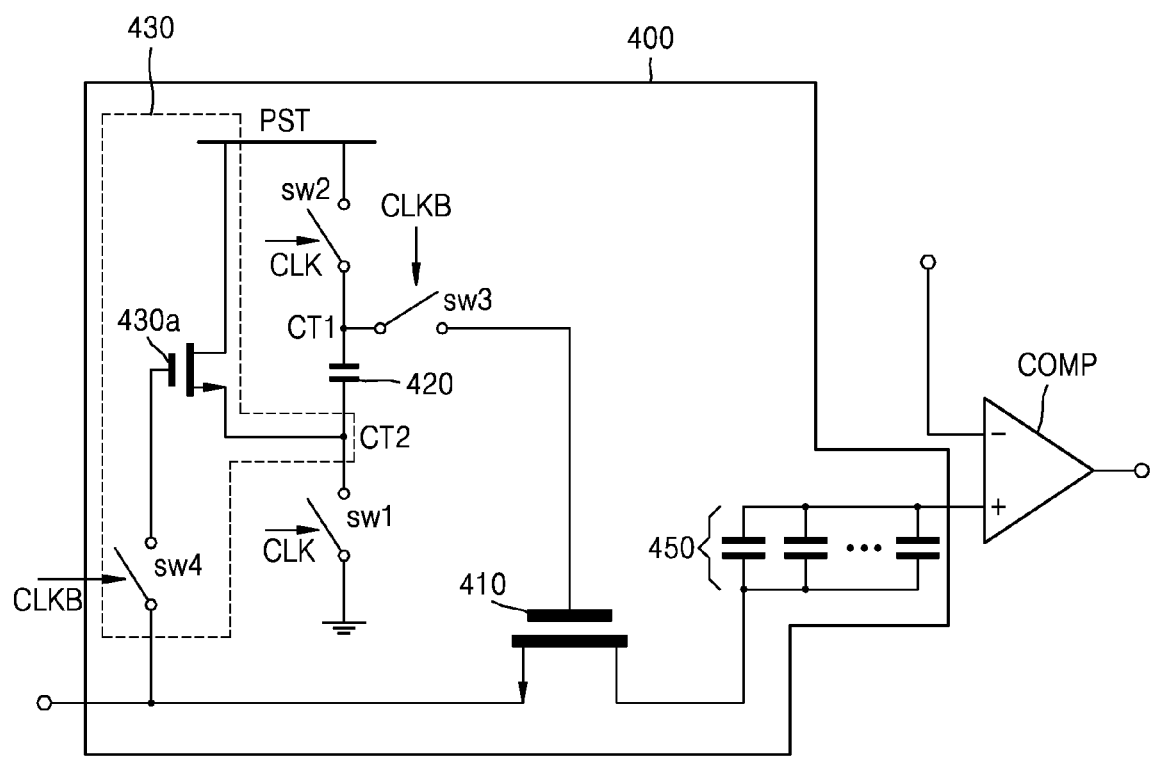
FIGS. 10A and 10B are circuit diagrams showing in detail a sample hold circuit according to another example embodiment.
Figure 10B:
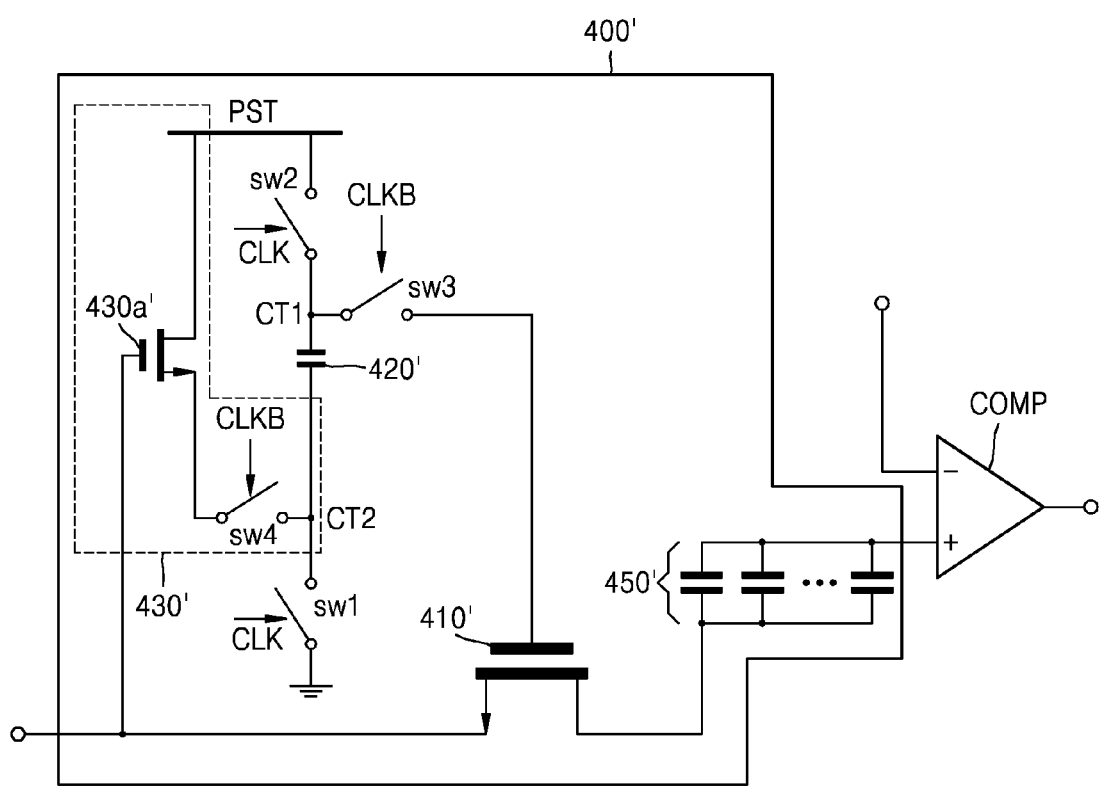

FIGS. 10A and 10B are circuit diagrams showing in detail sample hold circuits 400 and 400' according to other example embodiments.

Referring to FIG. 10A, unlike the sample hold circuit 300 of FIG. 6, a drain terminal of a second transistor 430a may be connected to a PST, and a gate terminal of the second transistor 430a may be connected to a source terminal of a first transistor 410 via a fourth switch device sw4.

Also, referring to FIG. 10B, unlike the sample hold circuit 300 of FIG. 6, a drain terminal of a second transistor 430a' may be connected to a PST, and a source terminal of the second transistor 430a' may be connected to a second capacitor terminal CT2 of a bootstrap capacitor 420'. As shown in FIGS. 10A and 10B, the second transistors 430a and 430a' may form a current path from a power source in the sample mode, to supply a charge to bootstrap capacitors 420 and 420'.

Figure 11:
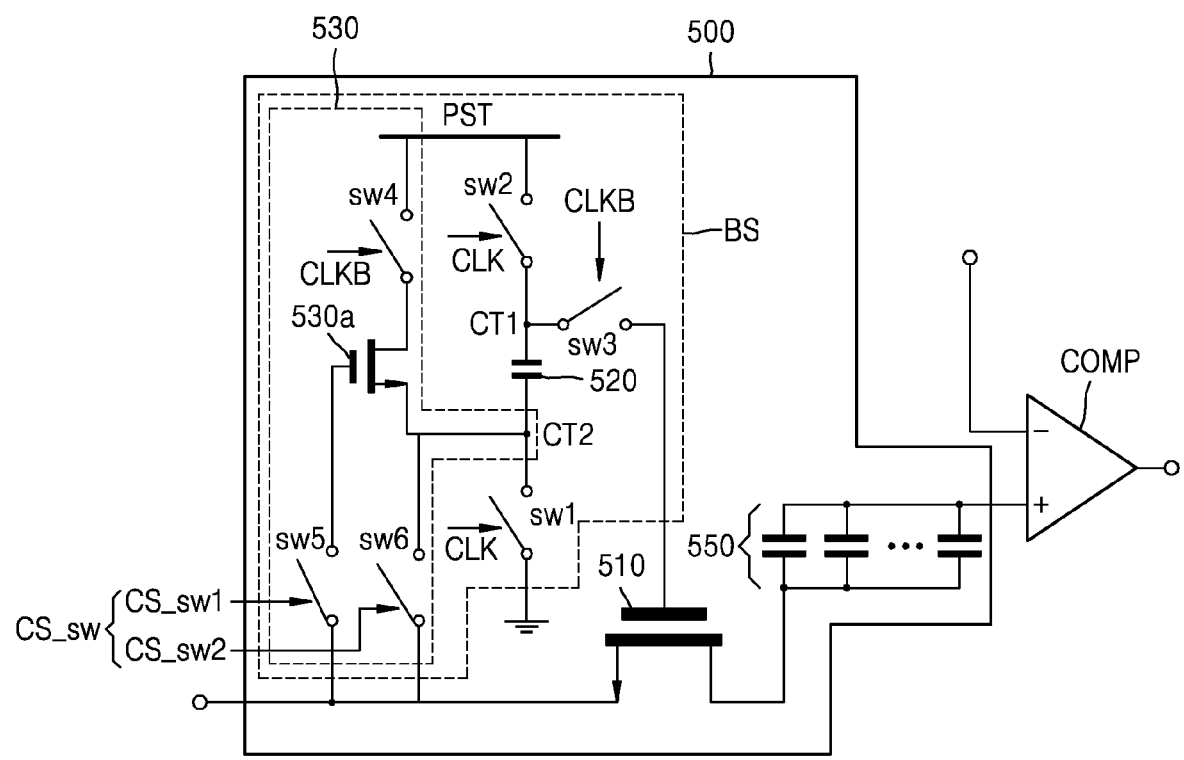
FIG. 11 is a circuit diagram showing in detail a sample hold circuit according to another example embodiment.

FIG. 11 is a circuit diagram showing in detail a sample hold circuit 500 according to another example embodiment.

Referring to FIG. 11, compared to the sample hold circuit 300 of FIG. 6, a charge supply circuit 530 may further include a fifth switch device sw5 and a sixth switch device sw6. A gate terminal of a second transistor 530a may be connected to a source terminal of a first transistor 510 via the fifth switch device sw5, and a source terminal of the second transistor 530a may be connected to the source terminal of the first transistor 510 via the sixth switch device sw6. On/off states of the fifth switch device sw5 and the sixth switch device sw6 may be controlled via a switch control signal CS_sw that is different from a clock signal CLK and a clock signal B CLKB.

The fifth switch device sw5 and the sixth switch device sw6 may be controlled based on a frequency of an analog input signal received by the sample hold circuit 500. According to an example embodiment, when the fifth switch device sw5 is in an on state via a first switch control signal CS_sw1, and the sixth switch device sw6 is in an off state via a second switch control signal CS_sw2, the charge supply circuit 530 may form a current path from a power source in a sample mode and supply a charge to a boost capacitor 520, as described above. Also, when the fifth switch device sw5 is in an off state via the first switch control signal CS_sw1, and the sixth switch device sw6 is in an on state via the second switch control signal CS_sw2, the charge supply circuit 530 may form a different current path in the sample mode to supply a charge to the boost capacitor 520. Detailed descriptions with respect to this aspect will be given with reference to FIG. 13. As shown above, the charge supply circuit 530 according to inventive concepts may form in the sample mode different current paths based on the frequency of the analog input signal, thereby supplying the charge to the boost capacitor 520.

Figure 12:
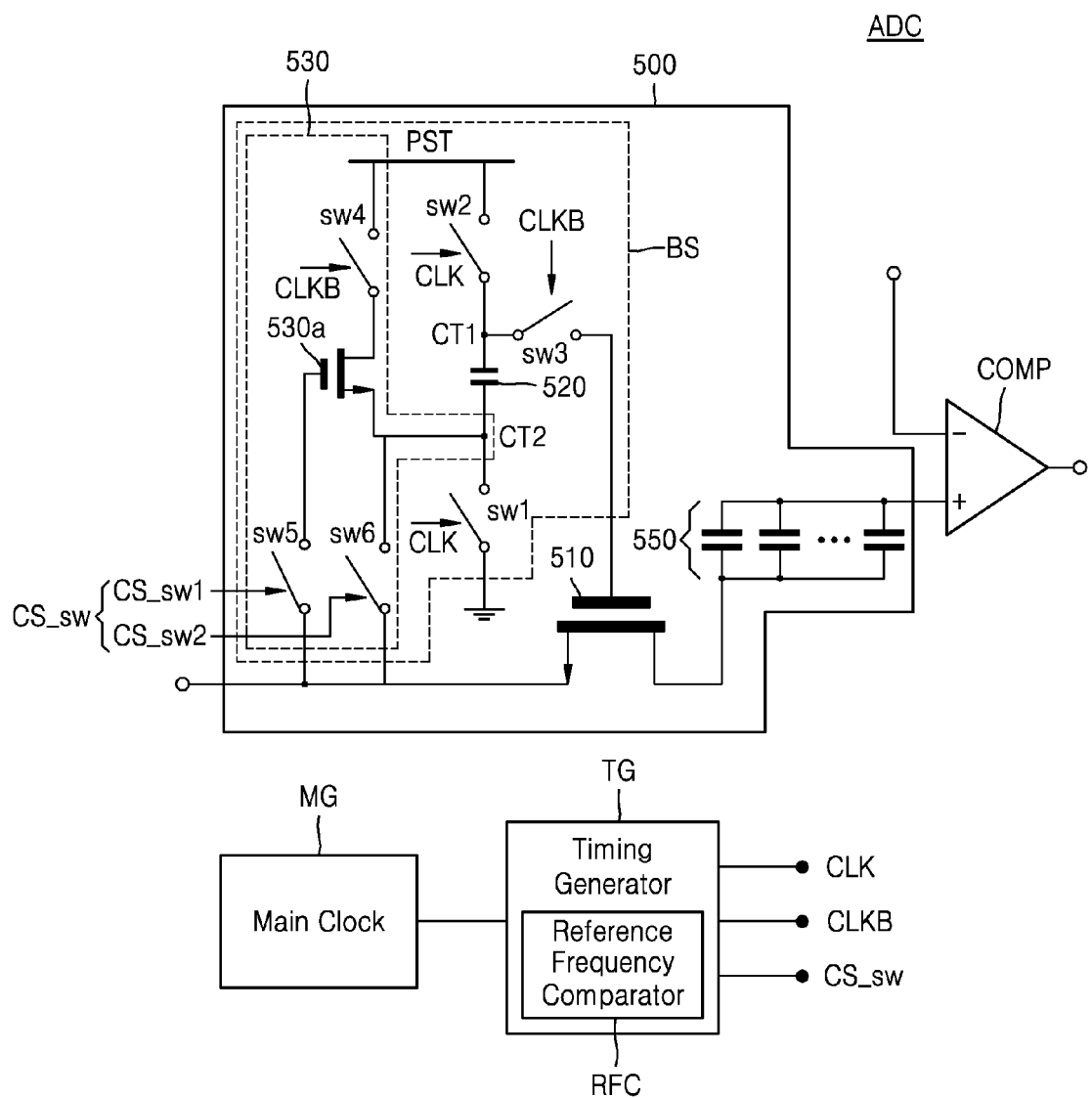
FIG. 12 is a circuit diagram showing an analog-to-digital converter according to another example embodiment.

FIG. 12 is a circuit diagram of an ADC according to another example embodiment.

Referring to FIG. 12, the ADC may include a sample hold circuit 500, a comparator COMP, a main clock generator MG, and a timing generator TG. The main clock generator MG according to an example embodiment may generate a main clock signal MCLK with respect to the ADC. The main clock signal MCLK may vary according to a frequency of an analog input signal received by the sample hold circuit 500. For example, the frequency of the analog input signal may be proportional to a frequency of the main clock signal MCLK.

The timing generator TG may generate a clock signal CLK for controlling a first switch device sw1 and a second switch device sw2 and a clock signal B CLKB for controlling a third switch device sw3 and a fourth switch device sw4, based on the main clock signal MCLK. Also, the timing generator TG may include a reference frequency comparator RFC. The reference frequency comparator RFC may compare the frequency of the main clock signal MCLK corresponding to the frequency of the analog input signal with a reference frequency and generate a result of the comparison. The timing generator TG may generate a switch control signal CS_sw for controlling a fifth switch device sw5 and a sixth switch device sw6 based on the result of the comparison. Information about the reference frequency may be pre-stored in a register included in the timing generator TG. According to an example embodiment, when the frequency of the main clock signal MCLK is less than the reference frequency, the timing generator TG may generate a switch control signal CS_sw for controlling the fifth switch device sw5 to be in an on state and the sixth switch device sw6 to be in an off state. Also, when the frequency of the main clock signal MCLK is greater than the reference frequency, the timing generator TG may generate a switch control signal CS_sw for controlling the fifth switch device sw5 to be in an off state and the sixth switch device sw6 to be in an on state.

As such, the timing generator TG may compare the frequency of the main clock signal MCLK corresponding to the frequency of the analog input signal with the reference frequency, and the charge supply circuit 530 may be controlled to form different current paths based on the result of the comparison to supply a charge to the boost capacitor 520. It is illustrated FIG. 12 that the ADC includes the main clock generator MG. However, inventive concepts are not limited thereto. The ADC may receive the main clock signal MCLK from the outside. Also, the reference frequency comparator RFC may directly compare the frequency of the analog input signal with the reference frequency and generate a comparison result, and the timing generator TG may generate the switch control signal CS_sw by using the comparison result.

Figure 13:
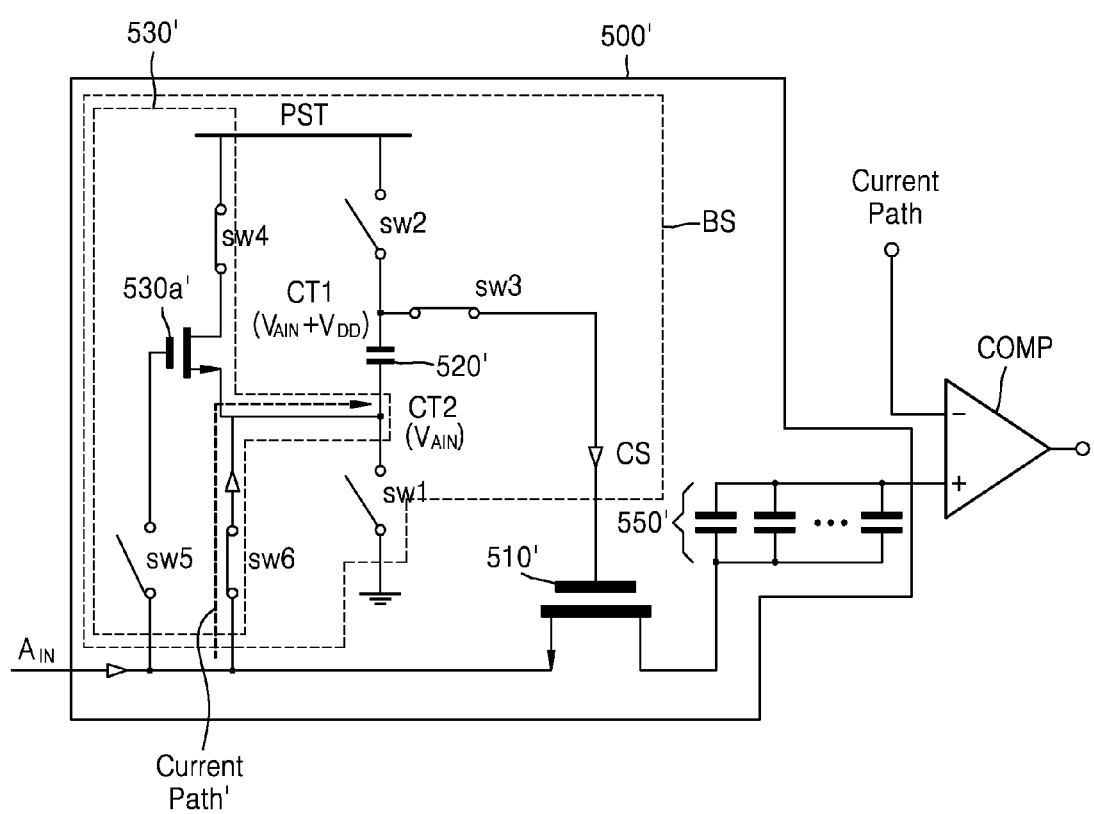
FIG. 13 is a circuit diagram for describing an operation of a sample hold circuit in a sample mode, according to another embodiment.

FIG. 13 is a circuit diagram for describing an operation of a sample hold circuit 500' in a sample mode according to another example embodiment.

Referring to FIG. 13, unlike FIG. 8, a charge supply circuit 530' may further include a fifth switch sw5 and a sixth switch sw6, and may control the fifth switch device sw5 to be in an off state and the sixth switch device sw6 to be in an on state in the sample mode. Accordingly, in the sample mode, a first capacitor terminal CT1 of a bootstrap capacitor 520' may be connected to a gate terminal of a first transistor 510' via a third switch device sw3 and a second capacitor terminal CT2 of the bootstrap capacitor 520' may be connected to a source terminal of the first transistor 510'.

Accordingly, the charge supply circuit 530' may form a current path Current Path' via which an analog input signal $A_{IN}$ is input to the second capacitor terminal CT2 of the bootstrap capacitor 520' in the sample mode and change a voltage of the second capacitor terminal CT2 of the bootstrap capacitor 520' from 0V to a voltage $V_{AIN}$, which is the same as the analog input signal $A_{IN}$.

Via the operation of the charge supply circuit 530', a voltage $V_{AIN}$ of the second capacitor terminal CT2 of the bootstrap capacitor 520' may track the analog input signal $A_{IN}$. Also, since the bootstrap capacitor 520' is pre-charged to a power source voltage $V_{DD}$ in the hold mode, in the sample mode, the first capacitor terminal CT1 of the bootstrap capacitor 520' may have a voltage of $V_{AIN}+A_{DD}$, which is the power source voltage $V_{DD}$ boosted in correspondence to the voltage $V_{AIN}$ of the second capacitor terminal CT2 of the bootstrap capacitor 520'. Thus, the on-resistance of the first transistor 510' may be maintained to be constant. As a result, the first transistor 510' may provide an analog output signal $A_{OUT}$, which is the same as the analog input signal $A_{IN}$, to a sampling capacitor array 550'.

According to an example embodiment of inventive concepts, an input impedance with respect to the analog input signal $A_{IN}$ of the sample hold circuit 500' performing a sample mode operation when the current path Current Path' is formed, as illustrated in FIG. 13, may be less than an input impedance with respect to the analog input signal $A_{IN}$ of the sample hold circuit 300 performing a sample mode operation when the current path is formed, as illustrated in FIG. 8.

Figure 14A:
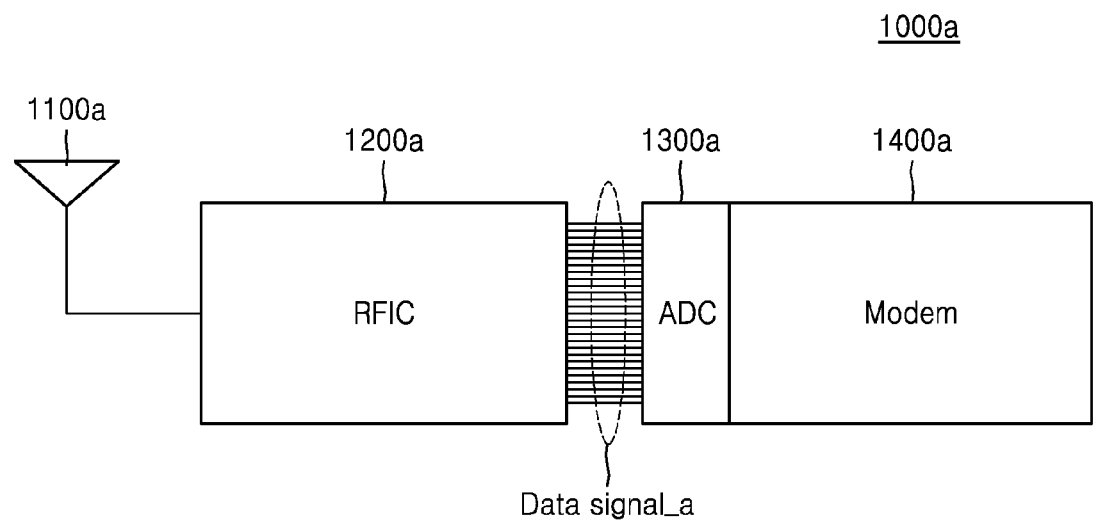
FIGS. 14A and 14B are block diagrams of a communication device according to an example embodiment.
Figure 14B:
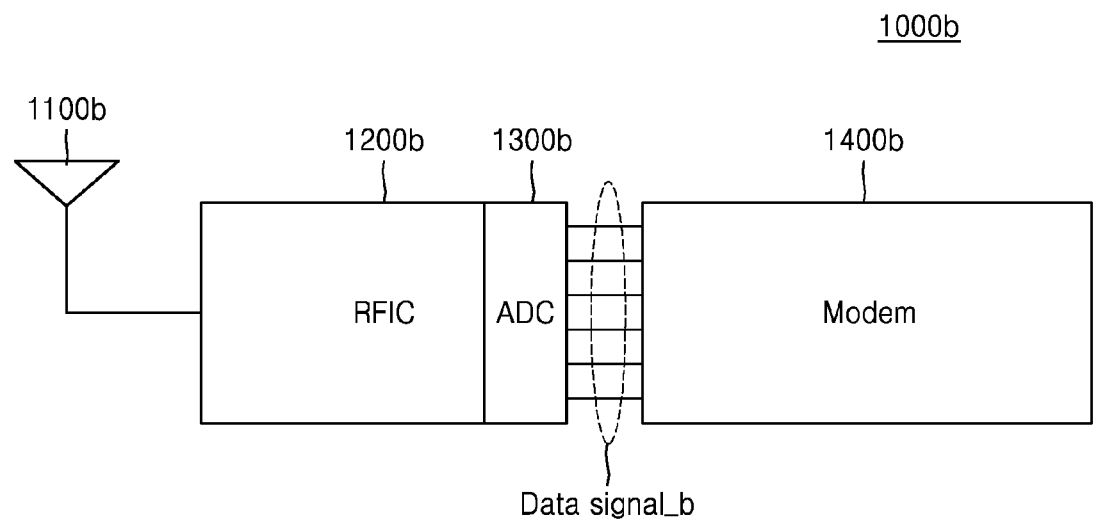

FIGS. 14A and 14B are block diagrams of communication devices 1000a and 1000b according to example embodiments.

Referring to FIG. 14A, the communication device 1000a may include an antenna 1100a, an RFIC 1200a, an ADC 1300*a*, and a modem 1400*a*. The RFIC 1200*a* may receive a wireless signal via the antenna 1100*a*, lower a frequency of the wireless signal to a baseband, and provide an analog type data signal DATA signal_a to the ADC 1300*a*. The ADC 1300*a* may convert the analog type data signal DATA signal_a to a digital type data signal, and the modem 1400*a* may convert the digital type data signal to a data signal which may be processed by an application processor AP. According to an example embodiment, the ADC 1300*a* and the modem 1400*a* may be realized as a single chip. The single chip including the ADC 1300*a* and the modem 1400*a* may be connected to the RFIC 1200*a* via a plurality of analog signal lines.

Referring to FIG. 14B, unlike FIG. 14A, an RFIC 1200*b* and an ADC 1300*b* may be realized as a single chip. The single chip including the RFIC 1200*b* and the ADC 1300*b* may transmit a digital type input signal DATA signal_b to a modem 1400*b*. The modem 1400*b* may convert the digital type input signal DATA signal_b into a data signal which may be processed by the AP. The single chip including the RFIC 1200*b* and the ADC 1300*b* may be connected to the modem 1400*b* via a plurality of digital signal lines.

When the RFIC 1200*b* and the ADC 1300*b* of FIG. 14B are realized as the single chip, the number of signal lines for transmitting the digital type input signal DATA signal_b to the modem 1400*b* may be less than the number of signal lines for transmitting the analog type input signal DATA signal_a, illustrated in FIG. 14A.

However, inventive concepts are not limited thereto, and the RFIC 1200*b*, the ADC 1300*b*, and the modem 1400*b* may be realized as a single chip. Further, the RFIC 1200*b*, the ADC 1300*b*, the modem 1400*b*, and the AP may be realized as a single chip.

Figure 15:
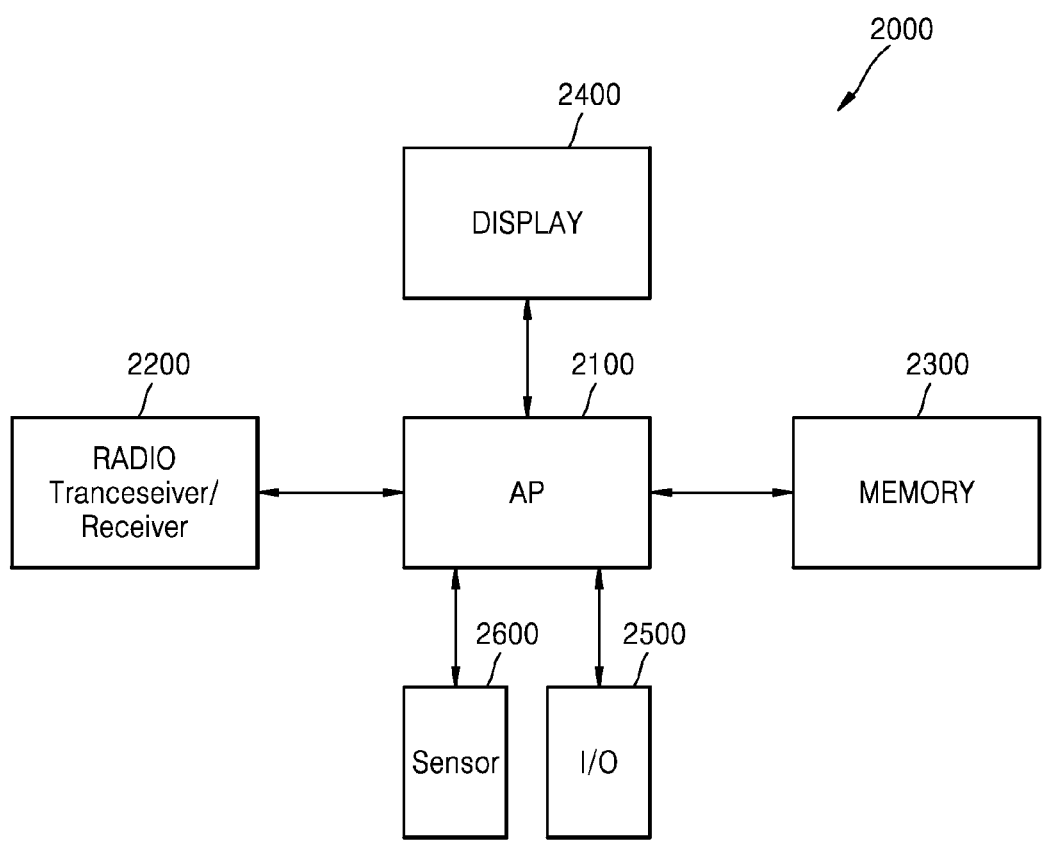
FIG. 15 is a block diagram of an internet of things (IoT) device according to an example embodiment.

FIG. 15 is a block diagram of an internet of things (IoT) device 2000 according to an example embodiment.

Referring to FIG. 15, an ADC according to the example embodiments of inventive concepts may be included in the IoT device 2000. The IoT may denote an inter-network among things using wired/wireless communication. The IoT device 2000 may include devices having an accessible wired or wireless interface and transmitting or receiving data to and from at least one another device by communicating with the at least one another device via the wired or wireless interface. The accessible interface may include a wired local area network (LAN), a wireless local area network (WLAN), such as Wi-Fi, a wireless personal area network (WPAN), such as Bluetooth, wireless universal serial bus (USB), ZigBee, near-field communication (NFC), radio-frequency identification (RFID), power line communication (PLC), or a modem communication interface which may access a mobile cellular network, such as third generation (3G), fourth generation (4G), long term evolution (LTE), etc. The Bluetooth interface may support Bluetooth low energy (BLE).

In detail, the IoT device 2000 may include a communication interface 2200 for communication with the outside. The communication interface 2200 may include, for example, a wired LAN, a wireless local area communication interface, such as Bluetooth, Wi-Fi, or ZigBee, a PLC, or a modem communication interface which may access a mobile cellular network, such as 3G, LTE, etc. The communication interface 2200 may include a transceiver and/or a receiver. The IoT device 2000 may transmit and/or receive information to and from access point or gateway via the transceiver and/or the receiver. Also, the IoT device 2000 may transmit and/or receive control information or data of the IoT device 2000 by communicating with a user device or another IoT device.

According to the example embodiment, the receiver included in the communication interface 2200 may include an ADC, and the ADC may be realized according to the example embodiments described with reference to FIGS. 1 through 14. In detail, the receiver included in the communication interface 2200 may include the ADC, and the ADC may include a transistor for receiving a control signal according to a sample mode and a hold mode via a control terminal, and receiving an analog input signal via an input terminal, and a bootstrap circuit for forming, in the sample mode, a current path from a power source so that a voltage of the control terminal of the transistor tracks the analog input signal in the sample mode.

The IoT device 2000 may further include a processor for performing calculations or an application processor 2100. The IoT device 2000 may include a battery as an internal power supply or may further include a power supply unit for receiving external power. Also, the IoT device 2000 may include a display 2400 for displaying an internal state or data. A user may control the IoT device 2000 via a user interface UI of the display 2400 of the IoT device 200. The IoT device 2000 may transmit the internal state and/or the data to the outside via the transceiver, and may receive a control command and/or data from the outside via the receiver.

The memory 2300 may store a control command code, control data, or user data for controlling the IoT device 2000. The memory 2300 may include at least one of volatile memory and nonvolatile memory. The nonvolatile memory may include at least one of various memories, such as read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (ReRAM), ferroelectric RAM (FRAM), etc. The volatile memory may include at least one of various memories, such as dynamic RAM (DRAM), static RAM (SRAM), synchronous DRAM (SDRAM), etc.

The IoT device 2000 may further include a storage device. The storage device may be a nonvolatile medium, such as a hard disk drive (HDD), a solid state disk (SSD), an embedded multimedia card (eMMC), universal flash storage (UFS), etc. The storage device may store user information provided via an input and output unit 2500 and sensing information collected via a sensor 2600.

While inventive concepts has been particularly shown and described with reference to example embodiments thereof, it will be understood that various changes in form and details may be made therein without departing from the spirit and scope of the following claims.

What is claimed is:

1. An analog-to-digital converter comprising:
    a sample hold circuit configured to receive an analog input signal and generate a sample signal based on an operating mode, the operating mode being one of at least two modes, the at least two modes including a sample mode and a hold mode; and
    a signal converter configured to convert the sample signal into a digital signal,
    wherein the sample hold circuit includes,
    a first transistor including a control terminal and a first terminal, the first transistor configured to receive a control signal and the analog input signal based on the operating mode, the first transistor configured to receive the control signal via the control terminal and receive the analog input signal via the first terminal, and a bootstrap switch operationally connected to the control terminal and the first terminal of the first transistor, the bootstrap switch configured to form a first current path from a power source based on the analog input signal and boost a voltage of the control terminal of the first transistor using the first current path in the sample mode.

2. The analog-to-digital converter of claim 1, wherein the sample hold circuit further includes a sampling capacitor configured to generate the sample signal, and
the first transistor is configured to transmit the analog input signal to the sampling capacitor via a second terminal in the sample mode.

3. The analog-to-digital converter of claim 1, wherein the bootstrap switch is configured to maintain a difference between the boosted voltage of the control terminal of the first transistor and a voltage of the first terminal in the sample mode.

4. The analog-to-digital converter of claim 1, wherein the bootstrap switch includes:
a charge supply circuit configured to receive the analog input signal and form the first current path, and
a bootstrap capacitor configured to receive a charge via the first current path in the sample mode.

5. The analog-to-digital converter of claim 4, wherein, a first terminal of the bootstrap capacitor is operationally connected to a terminal of the power source, and a second terminal of the bootstrap capacitor is operationally connected to a ground terminal in the hold mode, and
the first terminal of the bootstrap capacitor is operationally connected to the control terminal of the first transistor in the sample mode, and the second terminal of the bootstrap capacitor is operationally connected to the charge supply circuit in the sample mode.

6. The analog-to-digital converter of claim 5, wherein
the charge supply circuit includes a second transistor configured to form the first current path,
the analog-to-digital converter is configured to precharge the bootstrap capacitor to a power source voltage in the hold mode, and
the analog-to-digital converter is configured to generate a difference between the boosted voltage of the control terminal of the first transistor and a voltage of the first terminal of the first transistor, the difference being lower than the power source voltage by a threshold voltage of the second transistor.

7. The analog-to-digital converter of claim 5, wherein the charge supply circuit is configured to boost a voltage of the first terminal of the bootstrap capacitor in response to a voltage corresponding to the analog input signal in the sample mode.

8. The analog-to-digital converter of claim 5, wherein the terminal of the power source and the second terminal of the bootstrap capacitor forms the first current path.

9. The analog-to-digital converter of claim 5, wherein the charge supply circuit is configured to block the first current path based on the analog input signal and a voltage of the second terminal of the bootstrap capacitor.

10. The analog-to-digital converter of claim 5, wherein the bootstrap switch further includes:
a switch device connected between the second terminal of the bootstrap capacitor and the ground terminal,
wherein the switch device lowers a voltage of the second terminal of the bootstrap capacitor by a given voltage in response to a control signal with respect to the switch device such that the charge supply circuit operates when the hold mode is converted into the sample mode.

11. The analog-to-digital converter of claim 1, wherein the bootstrap switch is configured to form a second current path, based on a frequency of the analog input signal, and the bootstrap switch is configured to boost the voltage of the control terminal of the first transistor based on the second current path, and
the second current path is configured to transmit the analog input signal to the bootstrap switch.

12. A communication device comprising:
an analog-to-digital converter configured to convert an analog input signal into a digital signal based on an operating mode, the operating mode being one of at least two modes, the at least two modes including a sample mode and a hold mode,
wherein the analog-to-digital converter includes,
a first transistor configured to receive a control signal via a control terminal of the first transistor and receive the analog input signal via an input terminal; and
a bootstrap switch configured to form a current path from a power source, and the bootstrap switch is configured to control a voltage of the control terminal of the first transistor by using the current path in the sample mode, such that the voltage of the control terminal of the first transistor follows the analog input signal.

13. The communication device of claim 12, wherein the bootstrap switch includes:
a bootstrap capacitor operationally connected to the control terminal of the first transistor in the sample mode; and
a second transistor operationally connected to a terminal of the power source and the bootstrap capacitor in the sample mode and forming the current path based on the analog input signal.

14. The communication device of claim 13, wherein the second transistor is configured to generate a boosted voltage of a terminal of the bootstrap capacitor in response to a voltage corresponding to the analog input signal based on the current path.

15. The communication device of claim 12, wherein the communication device further comprises:
a radio frequency integrated circuit (RFIC) on a chip, the RFIC configured to,
receive a wireless signal from the outside,
convert a frequency band of the received wireless signal, and
generate the analog input signal, and
the analog-to-digital converter is on the same chip as the RFIC.

16. A sample hold circuit comprising:
a bootstrap capacitor having a first terminal and a second terminal; and
a charge supply circuit including a first transistor, the first transistor configured to receive an analog input signal, the first transistor operationally connected to the first terminal of the bootstrap capacitor,
the first transistor configured to reduce a noise generated in the sample hold circuit by maintaining a voltage difference between the second terminal of the bootstrap capacitor and the analog input signal, wherein the first transistor includes,
a control terminal configured to receive the analog input signal,
a first terminal configured to connect to a power source terminal, and a second terminal configured to connect to the first terminal of the bootstrap capacitor.

17. The sample hold circuit of claim 16, further comprising:
a first switch,
a second switch, a third switch, and
a fourth switch, wherein
a first terminal of the fourth switch is configured to receive the analog input signal,
a second terminal of the fourth switch is connected to the control terminal of the first transistor,
a first terminal of the second switch is connected to the power source terminal,
a second terminal of the second switch is connected to the first terminal of the bootstrap capacitor,
the second terminal of the first transistor is connected to a first terminal of the first switch, and
a first terminal of the third switch is connected to the second terminal of the bootstrap capacitor.

18. The sample hold circuit of claim 17, wherein
the first switch and the second switch are configured to open in response to a first voltage of a clock,
the first switch and the second switch are configured to close in response to a second voltage of the clock,
the third switch and the second switch are configured to open in response to the second voltage of the clock, and
the third switch and the second switch are configured to close in response to the first voltage of the clock.

19. The sample hold circuit of claim 18, wherein the first voltage of the clock corresponds to a command of the sample hold circuit to sample, and
the second voltage of the clock corresponds to a command of the sample hold circuit to hold.

* * * * *